US005886456A

United States Patent [19]

Stubbs et al.

[11] Patent Number: 5,886,456

[45] Date of Patent: Mar. 23, 1999

[54] ULTRASONIC TRANSDUCER AND ULTRASONIC DETECTION AND HIGH TEMPERATURE PROCESSING SYSTEMS INCORPORATING SAME

[75] Inventors: David A. Stubbs, Waynesville; Rollie E. Dutton, Beavercreek, both of Ohio

[73] Assignee: The University of Dayton, Dayton, Ohio

[21] Appl. No.: 919,769

[22] Filed: Aug. 28, 1997

Related U.S. Application Data

[60] Provisional application No. 60/024,959 Aug. 29, 1996.

[51] Int. Cl.$^{6}$ .................... H01L 41/08

[52] U.S. Cl. .................... 310/336; 310/334; 310/346

[58] Field of Search .................... 310/338, 346, 310/334–337, 326, 327

[56] References Cited

U.S. PATENT DOCUMENTS

| | | | |
|---|---|---|---|
| 2,439,130 | 4/1948 | Firestone | 310/336 X |
| 3,147,169 | 9/1964 | Albertson | 310/336 X |
| 3,756,070 | 9/1973 | Mc Elroy | 310/336 X |
| 3,921,442 | 11/1975 | Soloway | 310/336 X |
| 3,925,692 | 12/1975 | Leschek et al. | 310/346 X |
| 3,935,484 | 1/1976 | Leschek et al. | 310/346 X |
| 4,544,859 | 10/1985 | Eoff | 310/336 X |
| 4,578,611 | 3/1986 | Sadler | 310/346 X |
| 4,918,990 | 4/1990 | Fowler et al. | 310/336 X |
| 5,195,373 | 3/1993 | Light et al. | 310/336 X |

OTHER PUBLICATIONS

"High Frequency–High Temperature Ultrasonic Transducers" by N.D. Patel and P.S. Nicholson of Ceramic Engineering Research Group, pp. 131–133.

"High Frequency–High Temperature Ultrasonic Transducers" by N.D. Patel, S.X. Fulford and P.S. Nicholson from Review of Progress in Quantitative NDE, vol. 9, 1990.

"Development of Mid–MHz Range, High–Temperature Ultrasonic Transducers with ALN Elements" by N.D. Patel, P.H. Boldt and P.S. Nicholson from Ceramic Transactions, vol. 11, pp. 19–34, 1990.

*Primary Examiner*—Mark O. Budd
*Attorney, Agent, or Firm*—Killworth, Gottman, Hagan & Schaeff L.L.P.

[57] ABSTRACT

An ultrasonic transducer is provided comprising a transducer housing, a piezoelectric assembly, and a seating assembly. The transducer housing includes a front end, a rear end opposite the front end, and an ultrasonic window positioned at the front end. The piezoelectric assembly is positioned within the transducer housing and comprises a piezoelectric assembly substrate and a piezoelectric laminate formed over a front surface of the assembly substrate. The seating assembly is arranged to secure the piezoelectric assembly within the transducer housing such that at least a portion of the piezoelectric laminate is aligned with the ultrasonic window. The transducer housing, the assembly substrate, and the seating assembly are preferably constructed of high temperature and high pressure materials characterized by substantially equivalent coefficients of thermal expansion. The piezoelectric laminate may include a piezoelectric aluminum nitride layer and the assembly substrate may comprise a material selected from the group consisting of tungsten carbide, silicon carbide, silicon nitride, and graphite.

24 Claims, 5 Drawing Sheets

ULTRASONIC TRANSDUCER AND ULTRASONIC DETECTION AND HIGH TEMPERATURE PROCESSING SYSTEMS INCORPORATING SAME

STATEMENT REGARDING FEDERALLY SPONSORED RESEARCH OR DEVELOPMENT

The United States Government has rights in this invention pursuant to U.S. Air Force Contract No. F33615-95-C-5521.

CROSS REFERENCE TO RELATED APPLICATIONS

This application claims the benefit of U.S. provisional patent application Ser. No. 60/024,959, filed Aug. 29, 1996.

BACKGROUND OF THE INVENTION

The present invention relates to ultrasonic transducers and, in particular, to an ultrasonic transducer suitable for operation in high temperature and/or high pressure environments. Additionally, the present invention relates to a high temperature/pressure ultrasonic transducer having a compact and relatively simple a design utilizing a minimum number of transducer components. Finally, the present invention relates to high temperature ultrasonic detection and processing systems incorporating an ultrasonic transducer according to the present invention.

Ultrasonic transducers transmit and receive ultrasonic signals. The amplitude, frequency, and phase of the transmitted and received signals, as well as the time delay between transmission and receipt of the signals, are utilized to evaluate objects through which the signals travel and objects from which the signals are reflected. Accordingly, ultrasonic transducers are utilized in a number of applications to gather valuable diagnostic information. Unfortunately, conventional ultrasonic transducers are poorly suited for operation in high temperature or high pressure environments. For example, the temperature within a hot isostatic processing vessel commonly exceeds 300° C. and the pressure within the vessel commonly exceeds 34 MPa. Conventional ultrasonic transducers have limited utility in such environments because they cannot withstand heat and pressure of this magnitude.

Accordingly, there is a need for an ultrasonic transducer capable of accurate and precise operation within high pressure and high temperature materials processing and ultrasonic detection systems.

BRIEF SUMMARY OF THE INVENTION

This need is met by the present invention wherein an ultrasonic transducer suitable for operation in high temperature and/or high pressure environments and high temperature ultrasonic detection and processing systems incorporating such an ultrasonic transducer are provided.

In accordance with one embodiment of the present invention, an ultrasonic transducer is provided comprising a transducer housing, a piezoelectric assembly, and a seating assembly. The transducer housing includes a front end, a rear end opposite the front end, and an ultrasonic window positioned at the front end. The piezoelectric assembly is positioned within the transducer housing and comprises a piezoelectric assembly substrate and a piezoelectric laminate formed over a front surface of the assembly substrate. The seating assembly is arranged to secure the piezoelectric assembly within the transducer housing such that at least a portion of the piezoelectric laminate is aligned with the ultrasonic window.

The transducer housing, the assembly substrate, and the seating assembly are preferably constructed of high temperature and high pressure materials characterized by substantially equivalent coefficients of thermal expansion. The transducer housing may comprise an electrically conductive material and be conductively coupled to the piezoelectric laminate. The transducer housing may comprise an end cap adapted to engage a portion of the piezoelectric assembly extending through the ultrasonic window.

The piezoelectric assembly may further comprise an electrically insulating collar positioned between the transducer housing and the assembly substrate. The piezoelectric laminate may include a piezoelectric layer and a conductive layer formed over at least a portion of the piezoelectric layer. The piezoelectric laminate may include a piezoelectric aluminum nitride layer and the assembly substrate may comprise a material selected from the group consisting of tungsten carbide, silicon carbide, silicon nitride, and graphite.

At least a portion of the piezoelectric assembly may extend through the ultrasonic window. The assembly substrate may include a beveled front edge and the piezoelectric laminate may extend over the beveled front edge. The transducer housing may define a mating beveled surface formed at the front end of the housing and the seating assembly may be arranged to urge the beveled front edge towards the mating beveled surface. The assembly substrate is preferably mechanically coupled to the transducer housing via the seating assembly, and the seating assembly preferably comprises a spring member and a push rod positioned between, and in contact with, the assembly substrate and the spring member. The seating assembly may comprise a push rod positioned in a bore formed within the assembly substrate. The push rod is preferably mechanically coupled to the transducer housing via a spring member. The spring member may comprise a disk spring mounted upon a retaining ring coupled to the housing. Preferably, the push rod electrically couples an electrical signal line to the assembly substrate.

The transducer housing, the piezoelectric assembly, and the seating assembly are preferably constructed of materials that retain a substantial proportion of their structural, electrical, and chemical integrity under pressures above about 155 MPa and temperatures above about 900° C.

In accordance with another embodiment of the present invention, an ultrasonic detection system is provided comprising an electrically conductive fluid, an ultrasonic transducer positioned within the electrically conductive fluid, and a signal processor conductively coupled to the piezoelectric assembly substrate and the electrically conductive fluid. The ultrasonic transducer is positioned within the electrically conductive fluid and comprises a piezoelectric assembly including a piezoelectric assembly substrate and a piezoelectric laminate formed over a front surface of the assembly substrate. The transducer further comprises an electrically insulative shell surrounding the assembly substrate such that the electrically conductive fluid is electrically insulated from the assembly substrate and such that the electrically conductive fluid is conductively coupled to the piezoelectric laminate.

In accordance with yet another embodiment of the present invention, an ultrasonic detection system is provided comprising a heated material processing chamber, an ultrasonic transducer positioned within the processing chamber, a processing object positioned within the processing chamber in the ultrasonic path, and a signal processor conductively coupled to the ultrasonic transducer. The ultrasonic transducer defines an ultrasonic path and comprises: (i) a transducer housing including a front end, a rear end opposite the front end, and an ultrasonic window positioned at the front end; (ii) a piezoelectric assembly positioned within the transducer housing and comprising a piezoelectric assembly substrate and a piezoelectric laminate formed over a front surface of the assembly substrate; and a seating assembly arranged to secure the piezoelectric assembly within the transducer housing such that at least a portion of the piezoelectric laminate is aligned with the ultrasonic window. The piezoelectric assembly is preferably positioned in contact with the processing object.

Accordingly, it is an object of the present invention to provide a high temperature and high pressure ultrasonic transducer and detection and processing systems incorporating such an ultrasonic transducer.

DETAILED DESCRIPTION OF THE PREFERRED EMBODIMENTS

Figure 1:
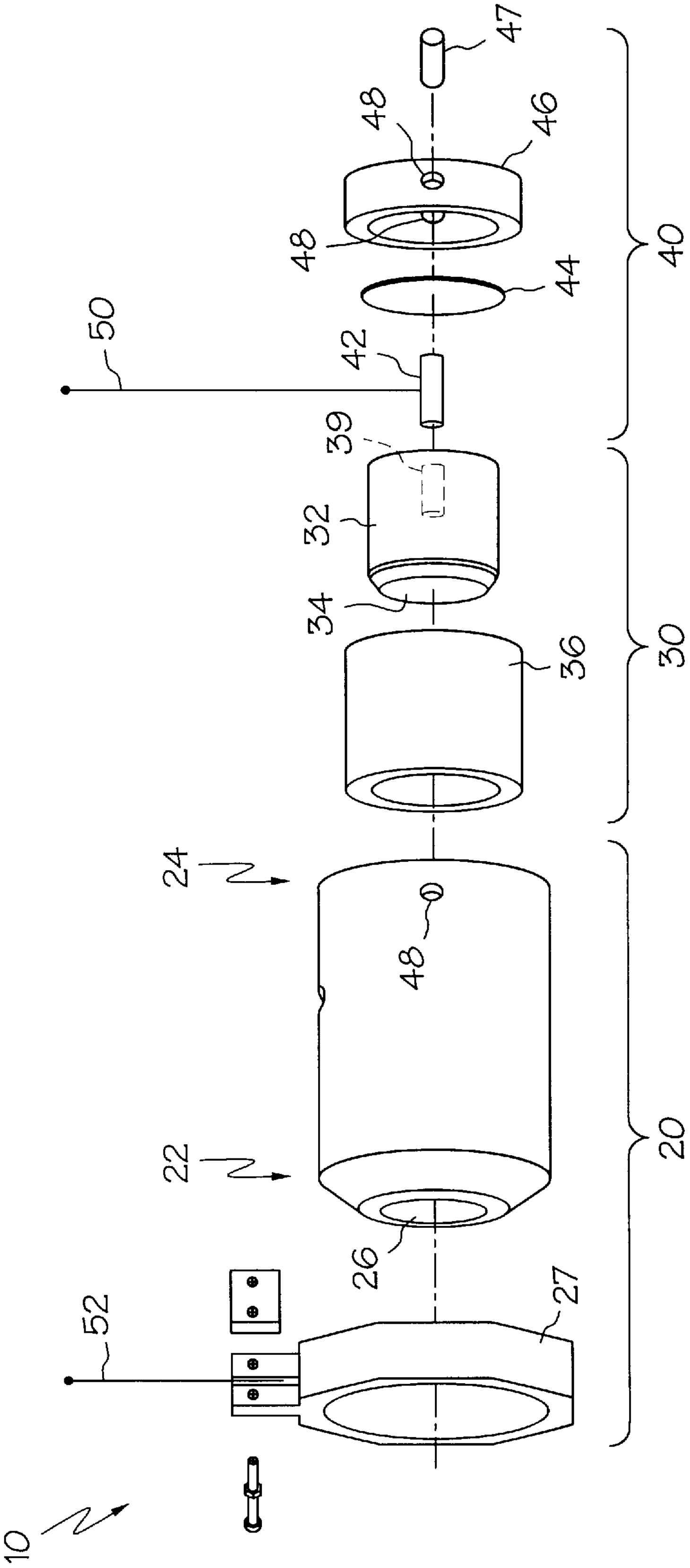
FIG. 1 is a schematic exploded view of an ultrasonic transducer according to the present invention.

FIG. 1 is a schematic exploded view of an ultrasonic transducer 10 according to the present invention. The ultrasonic transducer 10 comprises a transducer housing 20, a piezoelectric assembly 30, and a seating assembly 40. The housing 20 includes a front end 22, a rear end 24 opposite the front end 22, an ultrasonic window 26 positioned at the front end 22, and a wire clamping block 27. The piezoelectric assembly 30 is positioned within the transducer housing 20, see FIG. 2, and comprises a piezoelectric assembly substrate 32 and a piezoelectric laminate 34 formed over a front surface of the assembly substrate 32. The seating assembly 40 is arranged to secure the piezoelectric assembly 30 within the transducer housing 20 such that at least a portion of the piezoelectric laminate 34 is aligned with the ultrasonic window 26, see FIGS. 1 and 2. The assembly substrate 32 is mechanically coupled to the transducer housing 20 via the seating assembly 40.

According to one embodiment of the present invention, the piezoelectric laminate 34 includes a piezoelectric aluminum nitride layer 35 and an electrically conductive layer 33 of platinum formed over the piezoelectric aluminum nitride layer 35. These materials are particularly well suited for operation under high temperatures and high pressures. For the purposes of describing and defining the present invention, an ultrasonic window 26 comprises any structure designed to pass ultrasonic pulses, e.g., an aperture formed in the housing 20.

The transducer housing 20, the assembly substrate 32, and the seating assembly 40 are constructed of high temperature and high pressure materials, i.e., materials that retain a substantial proportion of their structural, electrical, and chemical integrity under pressures above about 34 MPa and/or temperatures above about 300° C. Preferably, the transducer housing 20, the piezoelectric assembly 30, and the seating assembly 40 are constructed of materials that retain a substantial proportion of their structural, electrical, and chemical integrity under pressures above about 155 MPa and temperatures above about 900° C. According to one embodiment of the present invention, the transducer housing 20, the piezoelectric assembly 30, and the seating assembly 40 are constructed of materials that retain a substantial proportion of their structural, electrical, and chemical integrity under a pressure of about 200 MPa and a temperature of about 1150° C. Further, the transducer housing 20, assembly substrate 32, and seating assembly 40 are formed of materials that are characterized by substantially equivalent coefficients of thermal expansion. For the purposes of defining and describing the present invention, substantially equivalent coefficients of thermal expansion comprise coefficients which will not lead to degradation of the operational integrity of the transducer 10 as the temperature of the transducer 10 increases. In this manner, the structural integrity of the transducer 10 is preserved as its temperature changes because specific components of the transducer 10 expand and contract at substantially equivalent rates. This aspect of the present invention is particularly important in high temperature environments, where large temperature fluctuations are common. Specific examples of appropriate materials for the assembly substrate 32 include tungsten carbide, silicon carbide, silicon nitride, and graphite. It is contemplated by the present invention that other suitable materials, such as nickel alloys, aluminum nitride, aluminum oxide, and sapphire may form the assembly substrate 32. Inconel® 625, a nickel chromium alloy available from Inco Alloys International, Inc., is suitable for the transducer housing 20 and some or all of the components of the seating assembly 40, particularly the push rod 42.

The transducer housing 20 comprises an electrically conductive material and is conductively coupled to the piezoelectric laminate 34. Specifically, referring to FIGS. 1 and 2, the piezoelectric laminate 34 includes the piezoelectric layer 35 and the conductive layer 33 formed over at least a portion of the piezoelectric layer 35. The assembly substrate 32 includes a beveled front edge 38 and the piezoelectric laminate 34 extends over the beveled front edge 38. The transducer housing 20 defines a mating beveled surface 28 at the front end 22 of the housing 20. The seating assembly 40 is arranged to urge the beveled front edge 38 towards the mating beveled surface 28. In this manner, the conductive layer 33, which extends over the beveled front edge 38, contacts, and is conductively coupled to, the conductive transducer housing 20 via the mating beveled surface 28.

An electrically insulating ceramic collar 36 is positioned between the transducer housing 20 and the assembly substrate 32 to insulate electrically the housing 20 from the assembly substrate 32. Accordingly, an electrical potential difference varying periodically in amplitude at a predetermined frequency can be created across the piezoelectric laminate 34 by coupling respective electrical signal lines to the assembly substrate 32 and the transducer housing 20. As will be appreciated by those skilled in the art, the periodic potential difference enables production and detection of ultrasonic energy at the transducer 10. In one embodiment of the present invention, an electrically conductive push rod 42 electrically couples a first electrical signal line 50 to the assembly substrate 32 and the wire clamping block 27 electrically couples the housing 20 to ground via a second electrical signal line 52.

It is contemplated by the present invention that the wire clamping block 27 can be a separate component bonded to the housing 20 or can be formed as an integral part of the housing 20 through conventional machining or casting methods. It is further contemplated by the present invention that the housing 20, the assembly substrate 32, and the push rod 42 need not be electrically conductive if appropriate supplemental electrical conductors are provided in the transducer structure. As will be appreciated by those practicing the present invention, the insulating collar 36 may not be necessary if the housing 20 or the substrate 32 are not conductive. As will be further appreciated by those practicing the present invention, supplemental electrically insulating material, not shown, may be provided between appropriate components of the housing 20, the seating assembly 40, and the piezoelectric assembly 30, to ensure proper operation of the transducer 10.

Figure 2:
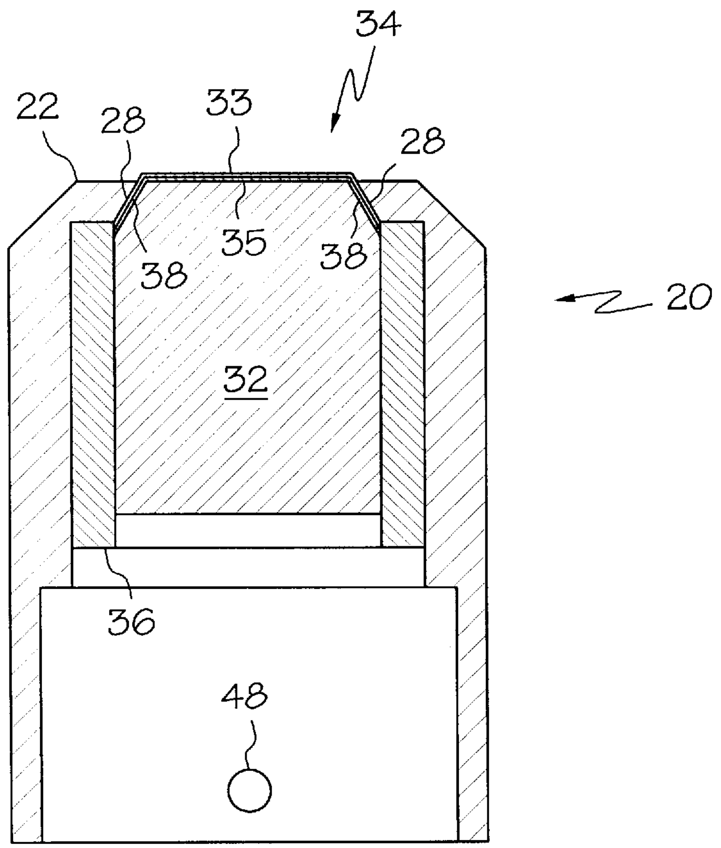
FIG. 2 is a plan view, in cross section, of an ultrasonic transducer according to the present invention.

Referring specifically to FIG. 2, according to one embodiment of the present invention, at least a portion of the piezoelectric assembly 30 extends through the ultrasonic window 26. In this manner, the piezoelectric assembly 30, which generates and receives the ultrasonic energy, may be placed into direct contact with an object under analysis. A detection system of this nature is described in detail herein with reference to FIG. 5. Further, according to another embodiment of the present invention, the front surface of the assembly substrate 32 is concave so as to define an ultrasonic focal point. As will be appreciated by those skilled in the art, the degree of concavity is a function of the preferred location of the focal point.

Referring again to FIG. 1, the seating assembly 40 comprises a spring member 44 and the push rod 42. The push rod 42 is positioned between, and in contact with, the assembly substrate 32 and the spring member 44. In the illustrated embodiment of the present invention, the push rod 42 is positioned in a bore 39 formed within the assembly substrate 32 and the spring member 44 comprises a rhenium disk spring mounted upon an electrically insulative ceramic retaining ring 46 coupled to the housing 20. The retaining ring 46 is coupled to the housing 20 via an electrically insulating ceramic retaining pin 47 extending through a series of axially aligned bores 48 formed in the housing 20 and the retaining ring 46.

Figure 3A:
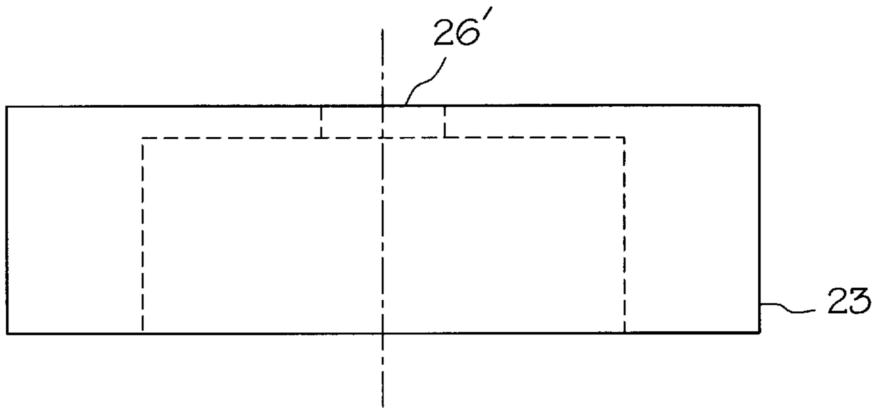
FIGS. 3A and 3B are plan views of a housing and an end cap according to an alternative embodiment of an ultrasonic transducer according to the present invention.
Figure 3B:
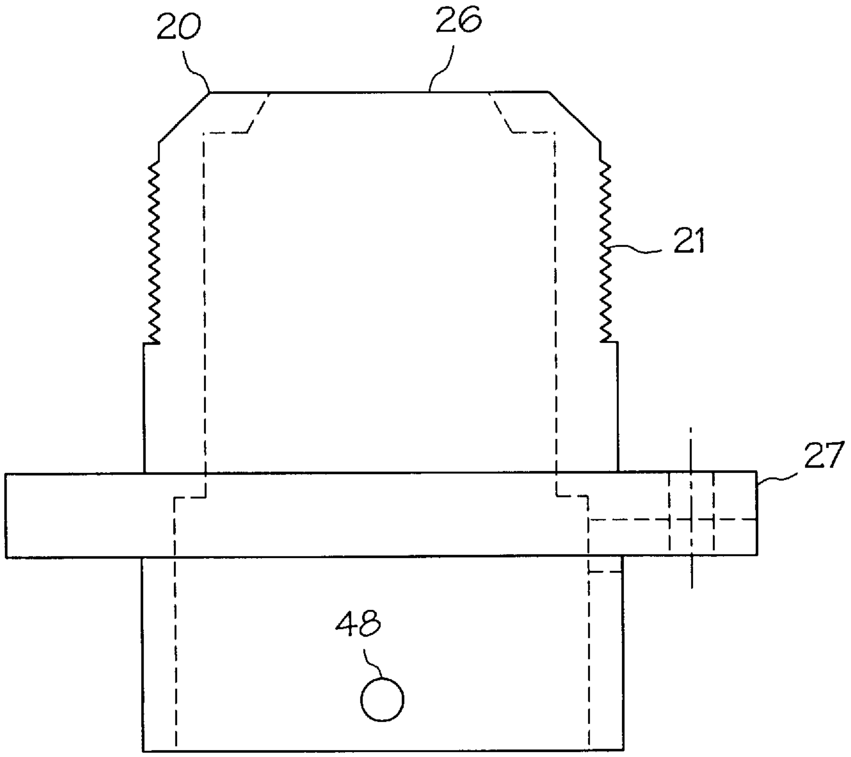

Referring now to FIGS. 3A and 3B, a transducer housing 20 including a threaded portion 21 and an end cap 23 is illustrated. The end cap 23 includes complementary threads, not shown, so as to securely engage, and conductively couple with, a portion of the piezoelectric assembly 30, see FIG. 2, extending through the ultrasonic window 26. An additional ultrasonic window 26' is provided in the end cap 23. This embodiment of the present invention provides for an alternative means of electrical contact between the housing 20 and the piezoelectric assembly 30 and an additional means of protecting the transducer 10 from hostile environments.

Figure 4:
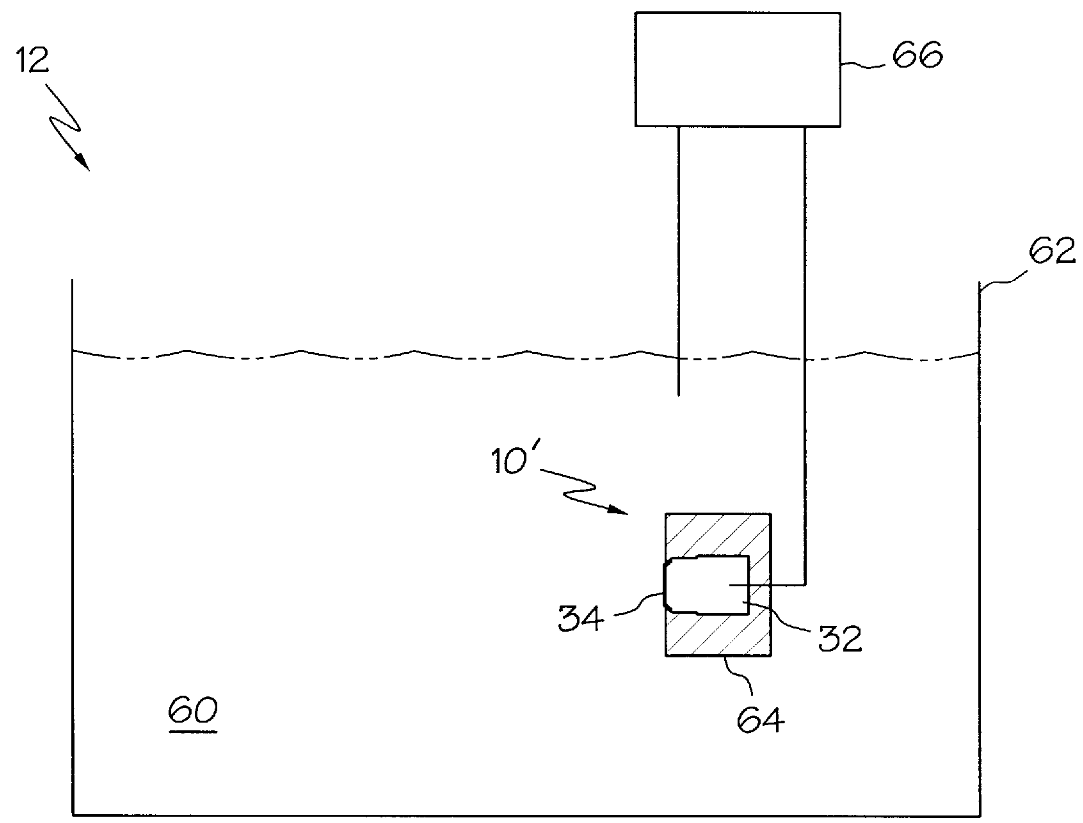
FIGS. 4–6 are schematic illustrations of ultrasonic detection systems according to the present invention.

Referring now to FIG. 4, an ultrasonic detection system 12 according to the present invention comprises an electrically conductive fluid 60, e.g., a molten metal, held within a fluid vessel 62. An ultrasonic transducer 10' is positioned within the electrically conductive fluid 60. The ultrasonic transducer 10' comprises a piezoelectric assembly 30' including the piezoelectric assembly substrate 32 and the piezoelectric laminate 34 formed over the front surface of the assembly substrate 32. An electrically insulative shell 64 surrounds the assembly substrate 32 such that the electrically conductive fluid 60 is electrically insulated from the assembly substrate 32 and such that the electrically conductive fluid 60 is conductively coupled to the piezoelectric laminate 34. A signal processor 66, e.g., an ultrasonic pulser/receiver, is conductively coupled to the piezoelectric assembly substrate 32 and the electrically conductive fluid 60 to facilitate proper operation of the transducer 10' in the manner described above with respect to the transducer 10 of FIGS. 1 and 2. According to this embodiment of the present invention, the ultrasonic transducer 10' is particularly well suited for the detection of inclusions within a molten metal.

Figure 5:
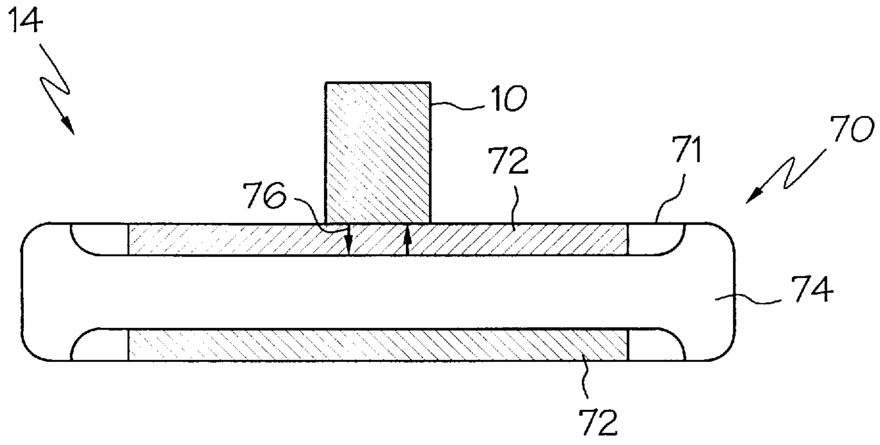

Referring now to FIGS. 1 and 5, an alternative ultrasonic detection system 14 according to the present invention comprises the ultrasonic transducer 10 and a workpiece 70 containing a target material 72, e.g., a metal alloy or powder to be heat treated. The workpiece 70 comprises a processing can 71, the target material 72, and a processing tool 74 positioned within the can 70. The processing can 71 typically comprises a hot isostatic pressing container and the processing tool 74 typically comprises a structural support or heat treatment tool. The transducer 10, or preferably the piezoelectric assembly 30 itself, is positioned in contact with the can 70. As will be appreciated by those of ordinary skill in the art practicing the present invention, analytical ultrasonic energy generated by the transducer 10 may be directed through the target material 72, as indicated by arrows 76, to provide an indication of the physical properties of the target material 72.

Figure 6:
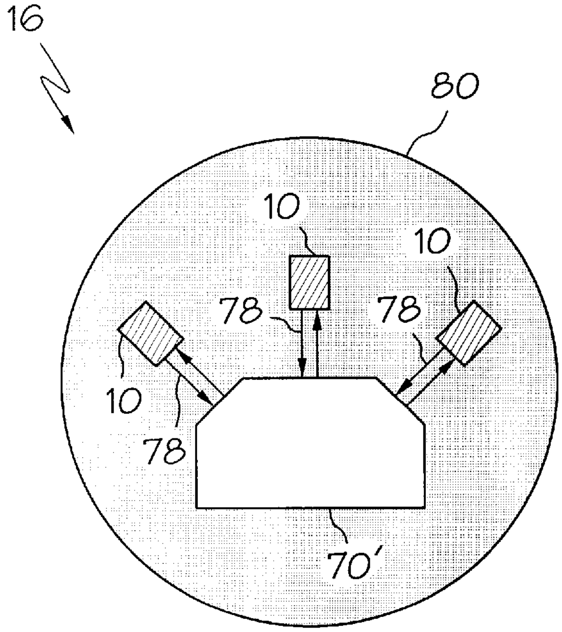

Referring now to FIGS. 1 and 6, a second alternative ultrasonic detection system 16 according to the present invention comprises a plurality of ultrasonic transducers 10 and a processing can 70', e.g., a hot isostatic pressing container, provided within a heated material processing chamber 80. The processing can or object 70' is positioned within the processing chamber 80 in ultrasonic paths 78 generated by the transducers 10. In this manner, the physical properties of the processing can 70', and of objects positioned within the processing can 70', can be evaluated within the heated material processing chamber 80.

Having described the invention in detail and by reference to preferred embodiments thereof, it will be apparent that modifications and variations are possible without departing from the scope of the invention defined in the appended claims.

What is claimed is:

1. An ultrasonic transducer comprising:

a transducer housing including a front end, a rear end opposite said front end, and an ultrasonic window positioned at said front end;

a piezoelectric assembly positioned within said transducer housing, said piezoelectric assembly comprising a piezoelectric assembly substrate and a piezoelectric laminate formed over a front surface of said assembly substrate, wherein said assembly substrate includes a beveled front edge and wherein said piezoelectric laminate extends over said beveled front edge; and a seating assembly arranged to secure said piezoelectric assembly within said transducer housing such that at least a portion of said piezoelectric laminate is aligned with said ultrasonic window.

2. An ultrasonic transducer as set forth in claim 1 wherein said transducer housing, said assembly substrate, and said seating assembly are constructed of high temperature and high pressure materials characterized by substantially equivalent coefficients of thermal expansion.

3. An ultrasonic transducer as set forth in claim 1 wherein said transducer housing comprises an electrically conductive material and is conductively coupled to said piezoelectric laminate.

4. An ultrasonic transducer as set forth in claim 1 wherein said front surface of said assembly substrate is concave so as to define an ultrasonic focal point.

5. An ultrasonic transducer as set forth in claim 1 wherein said piezoelectric assembly further comprises an electrically insulating collar positioned between said transducer housing and said assembly substrate.

6. An ultrasonic transducer as set forth in claim 1 wherein said piezoelectric laminate includes a piezoelectric layer and a conductive layer formed over at least a portion of said piezoelectric layer.

7. An ultrasonic transducer as set forth in claim 1 wherein said piezoelectric laminate includes a piezoelectric aluminum nitride layer.

8. An ultrasonic transducer as set forth in claim 1 wherein said piezoelectric laminate includes a piezoelectric aluminum nitride layer and said assembly substrate comprises a material selected from the group consisting of tungsten carbide, silicon carbide, and silicon nitride.

9. An ultrasonic transducer as set forth in claim 1 wherein at least a portion of said piezoelectric assembly extends through said ultrasonic window.

10. An ultrasonic transducer as set forth in claim 1 wherein said assembly substrate includes a beveled front edge, wherein said transducer housing defines a mating beveled surface formed at said front end of said housing, and wherein said seating assembly is arranged to urge said beveled front edge towards said mating beveled surface.

11. An ultrasonic transducer as set forth in claim 1 wherein said assembly substrate is mechanically coupled to said transducer housing via said seating assembly, and wherein said seating assembly comprises a spring member and a push rod positioned between, and in contact with, said assembly substrate and said spring member.

12. An ultrasonic transducer as set forth in claim 1 wherein said seating assembly comprises a push rod positioned in a bore formed within said assembly substrate.

13. An ultrasonic transducer as set forth in claim 12 wherein said push rod is mechanically coupled to said transducer housing via a spring member.

14. An ultrasonic transducer as set forth in claim 13 wherein said spring member comprises a disk spring and wherein said disk spring is mounted upon a retaining ring coupled to said housing.

15. An ultrasonic transducer as set forth in claim 12 wherein said push rod electrically couples an electrical signal line to said assembly substrate.

16. An ultrasonic transducer as set forth in claim 1 wherein said transducer housing, said piezoelectric assembly, and said seating assembly are constructed of materials that retain a substantial proportion of their structural, electrical, and chemical integrity under pressures above about 155 MPa and temperatures above about 900° C.

17. An ultrasonic transducer as set forth in claim 1 wherein said transducer housing comprises an end cap adapted to engage a portion of said piezoelectric assembly extending through said ultrasonic window.

18. An ultrasonic detection system comprising:

an electrically conductive molten material;

an ultrasonic transducer positioned within said electrically conductive molten material, said ultrasonic transducer comprising a piezoelectric assembly comprising a piezoelectric assembly substrate and a piezoelectric laminate formed over a front surface of said assembly substrate, wherein said piezoelectric laminate includes a piezoelectric aluminum nitride layer in direct contact with said electrically conductive molten material, and an electrically insulative shell surrounding said assembly substrate such that said electrically conductive molten material is electrically insulated from said assembly substrate and such that said electrically conductive molten material is conductively coupled to said piezoelectric laminate; and a signal processor conductively coupled to said piezoelectric assembly substrate and said electrically conductive molten material.

19. An ultrasonic detection system as set forth in claim 18 wherein said electrically conductive molten material is a molten metal.

20. An ultrasonic transducer comprising:

a transducer housing including a front end, a rear end opposite said front end, and an ultrasonic window positioned at said front end;

a piezoelectric assembly positioned within said transducer housing, said piezoelectric assembly comprising a piezoelectric assembly substrate and a piezoelectric laminate formed over a front surface of said assembly substrate, wherein said piezoelectric laminate includes a piezoelectric aluminum nitride layer and said assembly substrate comprises a tungsten carbide substrate; and a seating assembly arranged to secure said piezoelectric assembly within said transducer housing such that at least a portion of said piezoelectric laminate is aligned with said ultrasonic window.

21. An ultrasonic transducer comprising:

a transducer housing including a front end, a rear end opposite said front end, and an ultrasonic window positioned at said front end;

a piezoelectric assembly positioned within said transducer housing, said piezoelectric assembly comprising a piezoelectric assembly substrate and a piezoelectric laminate formed over a front surface of said assembly substrate, wherein said piezoelectric laminate includes a piezoelectric aluminum nitride layer and said assembly substrate comprises a silicon carbide substrate; and a seating assembly arranged to secure said piezoelectric assembly within said transducer housing such that at least a portion of said piezoelectric laminate is aligned with said ultrasonic window.

22. An ultrasonic transducer comprising:

a transducer housing including a front end, a rear end opposite said front end, and an ultrasonic window positioned at said front end;

a piezoelectric assembly positioned within said transducer housing, said piezoelectric assembly comprising a piezoelectric assembly substrate and a piezoelectric laminate formed over a front surface of said assembly substrate, wherein said piezoelectric laminate includes a piezoelectric aluminum nitride layer and said assembly substrate comprises a silicon nitride substrate; and a seating assembly arranged to secure said piezoelectric assembly within said transducer housing such that at least a portion of said piezoelectric laminate is aligned with said ultrasonic window.

23. An ultrasonic transducer comprising:

a transducer housing including a front end, a rear end opposite said front end, and an ultrasonic window positioned at said front end;

a piezoelectric assembly positioned within said transducer housing, said piezoelectric assembly comprising a piezoelectric assembly substrate and a piezoelectric laminate formed over a front surface of said assembly substrate; and a seating assembly arranged to secure said piezoelectric assembly within said transducer housing such that at least a portion of said piezoelectric laminate is aligned with said ultrasonic window, wherein said seating assembly comprises a push rod positioned in a bore formed within said assembly substrate, wherein said push rod is mechanically coupled to said transducer housing via a spring member, and wherein said spring member comprises a rhenium disk spring mounted upon a retaining ring coupled to said housing.

24. An ultrasonic transducer as set forth in claim 18 wherein said assembly substrate comprises a material selected from the group consisting of tungsten carbide, silicon carbide, and silicon nitride.

* * * * *